United States Patent [19]

Sakagami

[11] Patent Number: 5,227,697
[45] Date of Patent: Jul. 13, 1993

[54] DYNAMIC TYPE SEMICONDUCTOR MEMORY

[75] Inventor: Masahiko Sakagami, Osaka, Japan

[73] Assignee: Matsushita Electronic Corporation, Osaka, Japan

[21] Appl. No.: 618,800

[22] Filed: Nov. 28, 1990

[30] Foreign Application Priority Data

Dec. 1, 1989 [JP] Japan .................................. 1-313630

[51] Int. Cl.⁵ ............................................... G11C 7/00
[52] U.S. Cl. ..................................... 365/203; 365/205; 365/218
[58] Field of Search ................ 365/203, 218, 149, 205

[56] References Cited

U.S. PATENT DOCUMENTS

| | | | |
|---|---|---|---|
| 4,587,629 | 5/1986 | Dill et al. | 365/218 X |
| 4,601,017 | 7/1986 | Mochizuki et al. | 365/203 |
| 4,858,182 | 8/1989 | Pang et al. | 365/218 X |
| 4,879,686 | 11/1989 | Suzuki et al. | 365/218 X |

FOREIGN PATENT DOCUMENTS

| | | |
|---|---|---|
| 0321847 | 6/1989 | European Pat. Off. . |
| 0360526 | 3/1990 | European Pat. Off. . |
| 0079597 | 5/1985 | Japan ..................... 315/218 |
| 61-253695 | 11/1986 | Japan . |
| 0149899 | 6/1988 | Japan .............. 315/230.02 |

Primary Examiner—Eugene R. LaRoche
Assistant Examiner—Son Dinh
Attorney, Agent, or Firm—Lowe, Price, LeBlanc & Becker

[57] ABSTRACT

A dynamic type semiconductor memory in which a bit line is made to be connected to an electric potential different from a precharge potential after a precharge of the bit line is effected and one of word lines is selected and before a sensing amplifier operates. Thereby, all data stored in memory cells of the same row address can be cleared or preset in a cycle. Further, data stored in all of memory cells of which the number is equal to that of row addresses multiplied by that of column addresses can be cleared or preset in cycles of which the number is equal to that of the row addresses. Consequently, a clearance of contents of or a presetting of all memory cells can be effected at a high speed.

1 Claim, 11 Drawing Sheets

DYNAMIC TYPE SEMICONDUCTOR MEMORY

BACKGROUND OF THE INVENTION

1. Field of the Invention

This invention generally relates to a dynamic type semiconductor memory.

2. Description of the Related Art

Recently, with high integration of a semiconductor integrated circuit, development of a mass storage has been promoted. Especially, a dynamic type semiconductor memory has become utilized in various fields due to advantageousness to realization of a mass storage and a low cost per bit.

Generally, a semiconductor memory is fabricated by arranging memory cells like a matrix. (This matrix-like arrangement of the memory cells will be referred to as a memory-cell matrix). Further, when a semiconductor memory is operated, a specific one of the memory cells is first selected according to an externally given address and thereafter data is read from or written to the selected memory cell. The selection of a specific memory cell is performed by first dividing the externally given address into an address for selecting one of rows of the memory-cell matrix (hereunder referred to simply as a row address) and an address for selecting one of columns of the matrix (hereunder referred to simply as a column address) and further selecting a row of the memory-cell matrix (hereunder referred to as a word line) in accordance with a row address. Thereby, data stored in each of the memory cells on the word line is transmitted on a column of the memory-cell matrix (hereunder referred to as a bit line) connected thereto.

In case of the dynamic type semiconductor memory, since capacity of each memory cell is very small, change in electric potential of each bit line is also very small. Thus, a sense amplifier is connected to each of the bit lines. A read operation of reading data stored in a memory cell is effected by amplifying a very small change in electric potential of a corresponding bit line. Further, when data is written to a memory cell, a write operation is effected by forcedly applying data from an external circuit to a bit line, which is selected as above described, after the read operation is performed.

Incidentally, operations of reading data from and writing data to memory cells of the same row address are succeedingly effected in a relatively short time by changing a column address of a memory cell which data is read from or written to, with a word line selected.

However, in case of such a conventional dynamic type semiconductor memory, data can be written only to a memory cell of a specific address in a cycle (hereunder sometimes referred to as a write-operation cycle). It is therefore necessary for writing data to all of the memory cells to perform write operations in cycles of which the number is equal to that of all addresses (i.e., the number of row addresses multiplied by the number of column addresses). For example, in case of a conventional dynamic type semiconductor memory of which the capacity is one mega bits, write operations corresponding to 1,048,576 cycles need to be performed.

Similarly, in case where data stored in all of the memory cells is cleared (or preset), since only a memory cell corresponding to an address can be cleared (or preset) in a write-operation cycle, it is necessary to perform write operations corresponding to write-operation cycles of which the number is that of all addresses. Moreover, in case where data stored in the memory cells arranged on the same word line is cleared (or preset), it is similarly necessary to perform write operations corresponding to write-operation cycles of which the number is that of column addresses.

This is a large obstacle to an increase of an operating speed of an entire system employing the conventional dynamic type semiconductor memory.

The present invention is created to obviate the above described defect of the conventional dynamic type semiconductor memory.

It is therefore an object of the present invention to provide a dynamic type semiconductor memory which can clear (or preset) data at a high speed.

SUMMARY OF THE INVENTION

To achieve the foregoing object, in accordance with the present invention, there is provided a dynamic type semiconductor memory in which a bit line is made to be connected to an electric potential different from a precharge potential after a precharge of the bit line is effected and one of word lines is selected and before a sense amplifier operates.

More particularly, there is provided a dynamic type semiconductor memory including a plurality of pairs of bit lines and a plurality of word lines which are arranged like a matrix, each pair of bit lines including first and second lines; a plurality of memory cells connected to intersections of the plurality of pairs of bit lines and the plurality of word lines; a plurality of sense amplifiers for amplifying data stored in the plurality of memory cells; first connecting means for connecting the first line of each pair of bit lines to a first electric potential different from a pre-charge electric potential in response to a first reset signal after pre-charge of the plurality of bit lines is finished and further a word line is selected from the plurality of word lines and before the sense amplifier corresponding to the selected word line operates; second connecting means for connecting the second line of each pair of bit lines to a second electric potential different from the pre-charge electric potential and the first electric potential in response to a second reset signal, having a phase opposite to a phase of the first reset signal, after the pre-charge of the plurality of bit lines is finished and further the word line is selected from the plurality of word lines and before the sense amplifier corresponding to the selected word line operates; third connecting means for connecting the second line of each pair of bit lines to the first electric potential in response to a first preset signal after pre-charge of the plurality of bit lines is finished and further the word line is selected from the plurality of word lines and before the sense amplifier corresponding to the selected word line operates; and fourth connecting means for connecting the first line of each pair of bit lines to the second electric potential in response to a second preset signal, having a phase opposite to a phase of the first preset signal, after the pre-charge of the plurality of bit lines is finished and further the word line is selected from the plurality of word lines and before the sense amplifier corresponding to the selected word line operates.

Thereby, all data stored in memory cells of the same row address can be cleared (or preset) in a cycle. Further, data stored in all memory cells (i.e., memory cells of which the number is equal to that of row addresses multiplied by that of column addresses) can be cleared (or preset) in cycles of which the number is equal to that of the row addresses. Consequently, a clearance of contents of (or presetting of) all memory cells can be effected at a high speed.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Hereinafter, preferred embodiments of the present invention will be described in detail by referring to the accompanying drawings.

First, a first embodiment of the present invention will be described hereinbelow by referring to FIGS. 1 to 5.

Figure 1:
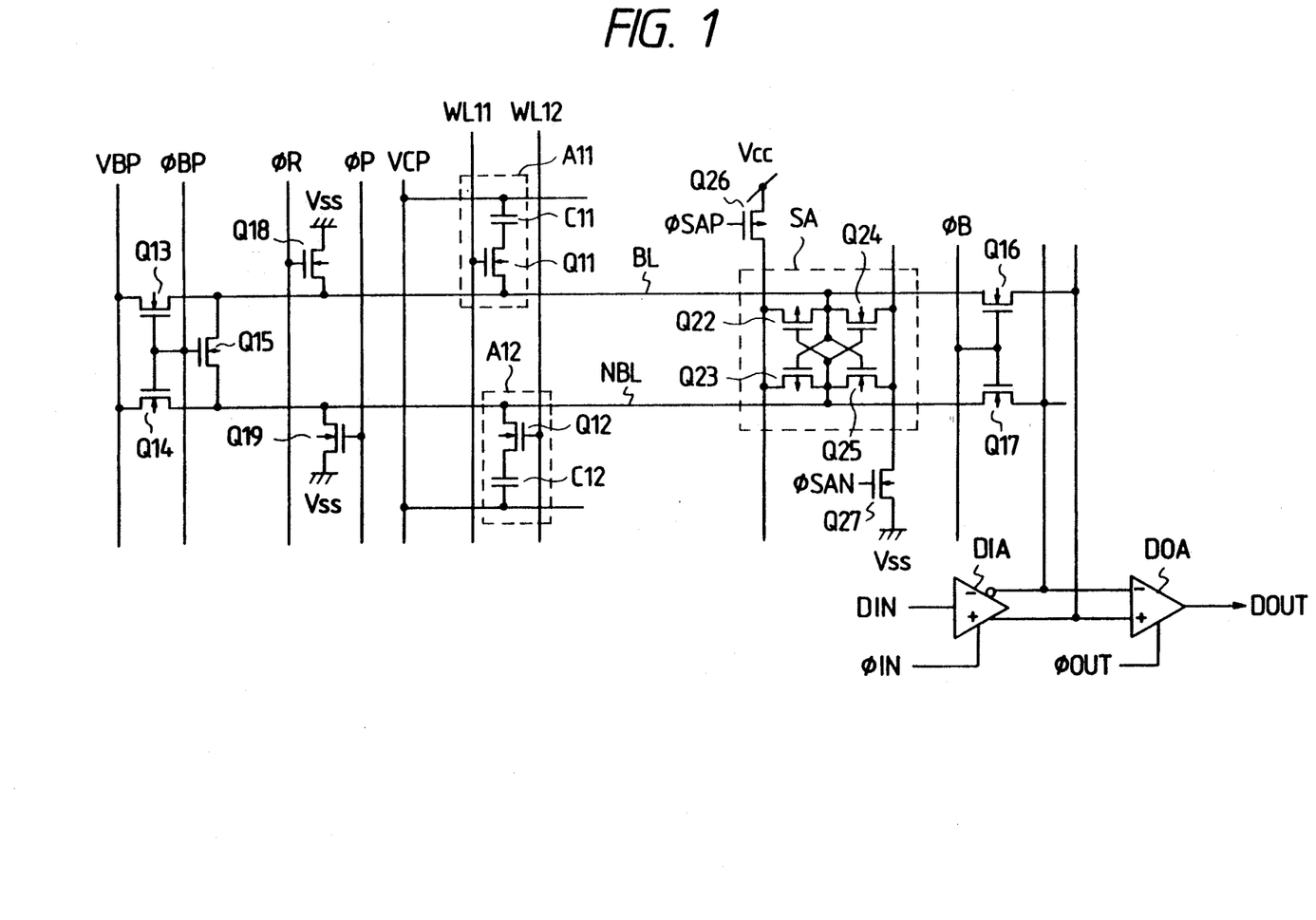
FIG. 1 is a circuit diagram of a first embodiment of the present invention (i.e., a first dynamic type semiconductor memory embodying the present invention)

Referring first to FIG. 1, there is shown only a part of the first embodiment, in which two bit lines BL and NBL and two word lines WL11 and WL12 intersect. As shown in this figure, a memory cell A11 consists of a capacitor C11 and a transistor Q11. An end of the capacitor C11 is connected to a cell plate voltage (VCP). Further, a drain and a gate of the transistor Q11 are connected to the bit line BL and the word line WL11, respectively. Moreover, a memory cell A12 consists of a capacitor C12 and a transistor Q12. An end of the capacitor C12 is connected to the cell plate voltage (VCP). Further, a drain and a gate of the transistor Q12 are connected to the bit line NBL and the word line WL12, respectively. An end of the bit line BL is connected to a bit-line precharge voltage line (VBP) by way of a transistor Q13. Moreover, an end of the bit line NBL is connected to the bit-line precharge voltage line VBP through a transistor Q14. The two bit lines BL and NBL are connected to each other through a transistor Q15. Furthermore, a bit-line precharge signal $\phi$BP is supplied to gates of the transistors Q13, Q14 and Q15. On the other hand, the other end of the bit line BL is connected to an input terminal of a data output amplifier DOA through a transistor Q16. Further, the other end of the bit line NBL is connected to the other input of the data output amplifier DOA through a transistor Q17. A bit-line selecting signal $\phi$B is supplied to gates of these transistors Q16 and Q17.

A sense amplifier SA comprised of four transistors $Q_{22} \sim Q_{25}$ is connected to both of the two bit lines BL and NBL. Further, a transistor $Q_{26}$ which is turned on and off by an enable pulse $\phi$SAP is connected to both of and is positioned between the sense amplifier SA and a power source having an electric potential Vcc. Moreover, a transistor $Q_{27}$ which is turned on and off by an enable pulse $\phi$SAN is connected to and is positioned between the sense amplifier SA and a ground having a reference potential Vss.

Furthermore, input data DIN to be written to the memory cells A11 and A12 is amplified by a data input amplifier DIA and is then supplied to the two bit lines BL and NBL. On the other hand, data read out from the memory cells A11 and A12 is supplied to the data output amplifier DOA through the two bit lines BL and NBL and thereafter the read-out data is outputted from an output terminal DOUT. The data input amplifier DIA is activated when a voltage level of an enable pulse $\phi$IN becomes high (hereunder abbreviated as "H") in a write-operation cycle. Further, a voltage level of an enable pulse $\phi$OUT is low (hereunder abbreviated as "L") in a write-operation cycle, so that the data output amplifier DOA is inactive. Contrarily, in a cycle in which a read operation is effected (hereunder sometimes referred to as a read-operation cycle), a voltage level of an enable pulse $\phi$IN is "L" and a voltage level of an enable pulse $\phi$OUT is "H". Thus, in a read-operation cycle, the data input amplifier DIA is inactive and on the other hand the data output amplifier DOA is active.

A characteristic feature of the first embodiment of FIG. 1 resides in that an N-channel transistor $Q_{18}$ is connected to both of and is positioned between the bit line BL and the ground having the reference potential Vss and moreover another N-channel transistor $Q_{19}$ is connected to both of and is provided between the other bit line NBL and the ground having the reference potential Vss. Incidentally, a reset signal $\phi$R is supplied to a gate of the transistor $Q_{18}$, and on the other hand a preset signal $\phi$R is supplied to a gate of the transistor $Q_{19}$.

Next, an operation of the first embodiment of FIG. 1 will be described hereinafter by referring to FIGS. 2~5.

First, when a voltage level of a bit-line precharge signal $\phi$BP becomes "H", the bit lines BL and NBL are pre-charged up to a bit-line pre-charge potential VBP through the transistors $Q_{13}$ and $Q_{14}$ and further is equalized through the transistor $Q_{15}$. Thereafter, when the pre-charge of the bit lines BL and NBL is completed, a word line is selected in accordance with an externally given row address.

Here, will be described an operation of the first embodiment in case where the word line WL11 is selected. When a voltage level of the word line WL11 becomes "H", electric charge accumulated in the capacitor C11 is transferred to the bit line BL through the transistor Q11. Further, if a voltage level of an enable pulse $\phi$SAN for the sense amplifier SA becomes "H" and on the other hand a voltage level of another enable pulse $\phi$SAP for the sense amplifier SA becomes "L", the sense amplifier SA operates and data transferred to the bit line BL is amplified. When a voltage level of the bit selecting signal $\phi$B is made to be "H" and moreover a voltage level of an enable pulse $\phi$IN for the data input amplifier DIA is made to be "H" in this state (incidentally, the data output amplifier DOA is inactive because it is in a write-operation cycle), the data representing "H" is written to the memory cell A11 in case where the input data DIN represents "H", and on the other hand the data representing "L" is written to the cell A11 in case where the input data represents "L".

Next, will be described hereinbelow an operation of the first embodiment in case where the word line WL12 is selected. When a voltage level of the word line WL12 becomes "H", electric charge accumulated in the capacitor C12 is transferred to the bit line NBL through the transistor Q12. Further, if a voltage level of an enable pulse $\phi$SAN for the sense amplifier SA becomes "H" and on the other hand a voltage level of another enable pulse $\phi$SAP for the sense amplifier SA becomes "L", the sense amplifier SA operates and data transferred to the bit line NBL is amplified. When a voltage level of the bit selecting signal $\phi$B is made to be "H" and moreover a voltage level of an enable pulse $\phi$IN for the data input amplifier DIA is made to be "H" in this state (incidentally, the data output amplifier DOA is inactive because it is in a write-operation cycle), the data representing "L" is written to the memory cell A11 in case where the input data DIN represents "H", and on the other hand the data representing "H" is written to the cell A11 in case where the input data represents "L".

That is, data which is in phase with input data is written to a memory cell connected to the bit line BL. In contrast, data of which the phase is opposite to that of input data is written to a memory cell connected to the bit line NBL.

Incidentally, in the above described cycles in which an ordinary read and write operations are performed, voltage levels of a reset signal $\phi$R and a preset signal $\phi$P are "L" and the transistors $Q_{18}$ and $Q_{19}$ are off. Thus, the bit lines BL and NBL are not connected to the reference potential Vss.

Next, will be described hereinbelow an operation of the first embodiment in case of clearing data stored in the first embodiment.

Upon completion of the precharge of the bit lines, a voltage level of a reset signal $\phi$R is made to be "H" after either of the word lines is selected and before the sense amplifier operates. Thereby, the transistor Q18 is turned on and further an electric potential of the bit line BL is forcedly made to be equal to the reference potential Vss. Generally, a capacity of a memory cell is far smaller than (i.e., approximately one-tenth to one-thirtieth of) a capacity of a bit line. Therefore, an electric potential of the bit line NBL is higher than the reference potential Vss whichever memory cell is selected. Thus, after the sense amplifier SA operates, a voltage level of the bit line BL becomes "L" and a voltage level of the bit line NBL becomes "H". In case where the memory cell A11 connected to the bit line BL is selected when the first embodiment is in this state, data representing "L" is written to the memory cell A11 (see FIG. 2). In contrast, in case where the memory cell A12 connected to the bit line NBL is selected, data representing "H" is written to the memory cell A12 (see FIG. 3).

Figure 2:
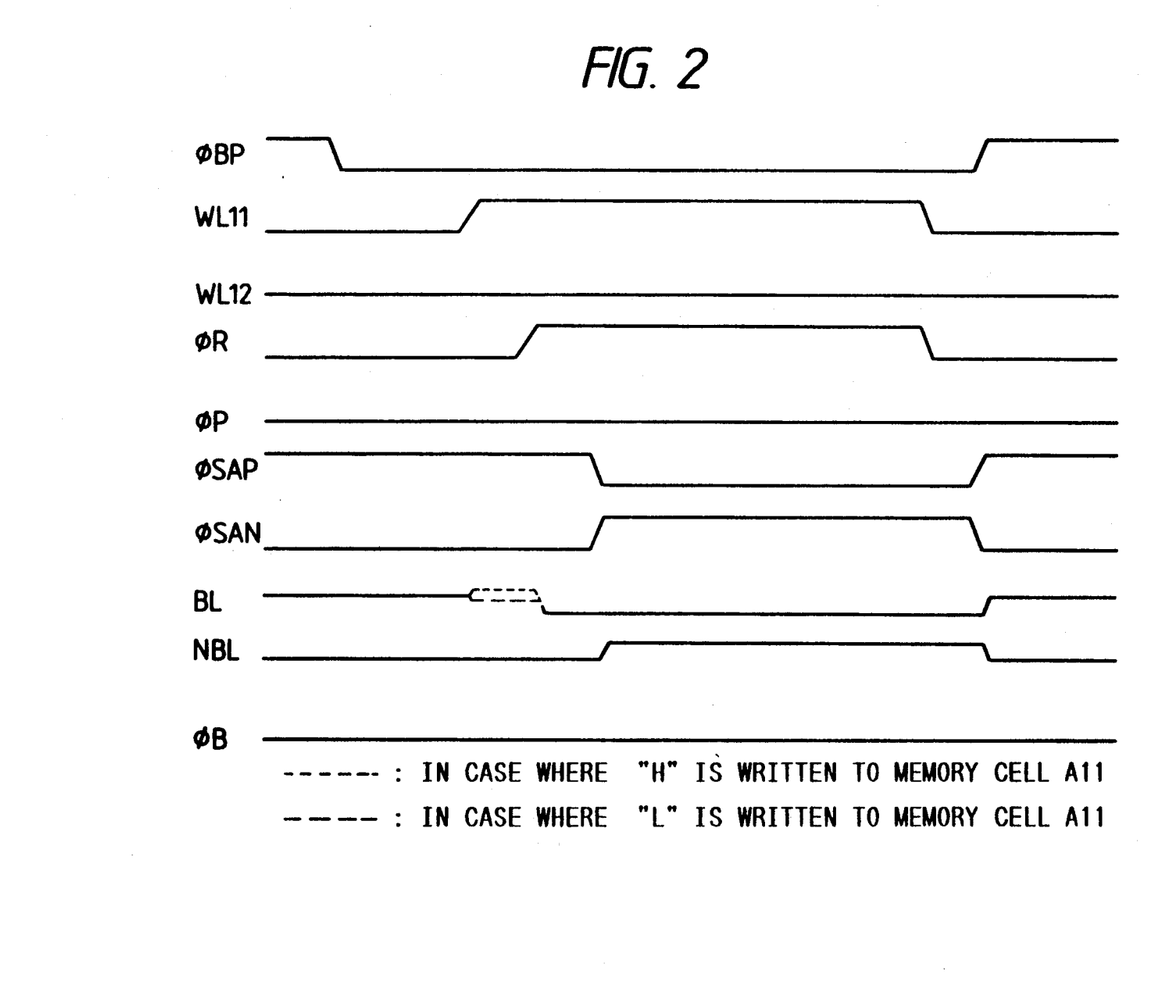
FIG. 2 is a timing chart for illustrating a clearing operation of the first embodiment of FIG. 1 in case where a memory cell connected to a bit line BL is selected.
Figure 3:
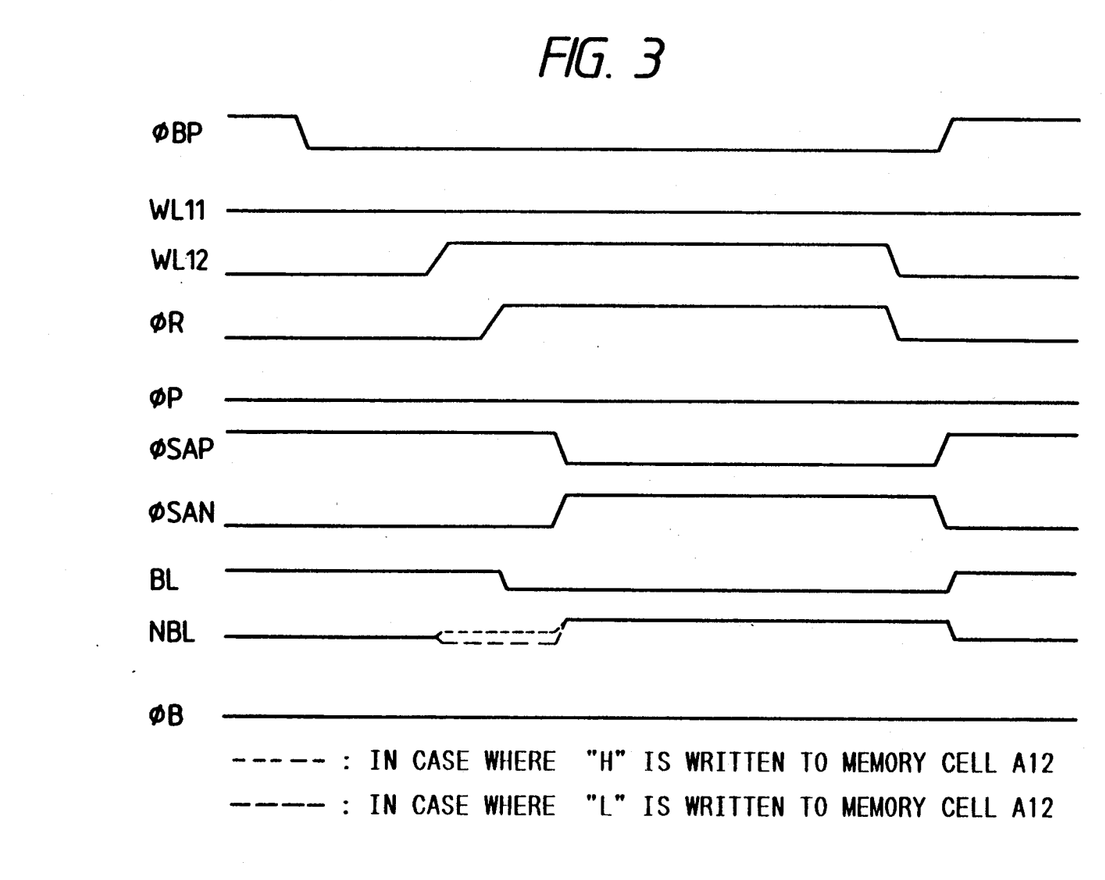
FIG. 3 is a timing chart for illustrating a clearing operation of the first embodiment of FIG. 1 in case where a memory cell connected to a bit line NBL is selected.

When data is read from either of the memory cells A11 and A12, in case where the data is read from the memory cell A11, data representing "L", which is in phase with the written data representing "L", is outputted therefrom. On the other hand, in case where the data is read from the memory cell A12, data representing "L", of which the phase is opposite to that of the written data representing "H", is outputted therefrom.

That is, if a word line is selected when a voltage level of the reset signal $\phi$R is made to be "H", it has come that data stored in all of the memory cells arranged on the selected word line is cleared in one cycle. Thus, in order to clear data stored in all of the memory cells of the first embodiment, the first embodiment has only to perform clearing operations in cycles of which the number is equal to that of the row addresses (i.e., that of the word lines).

Next, will be described hereinbelow an operation of the first embodiment in case of performing preset of data in the first embodiment.

Upon completion of the precharge of the bit lines, a voltage level of a preset signal $\phi$P is made to be "H" after either of the word lines is selected and before the sense amplifier operates. Thereafter, when the sense amplifier SA is operated, a voltage level of the bit line BL becomes "H" and a voltage level of the bit line NBL becomes "L". In case where the memory cell A11 connected to the bit line BL is selected when the first embodiment is in this state, data representing "H" is written to the memory cell A11 (see FIG. 4). In contrast with this, in case where the memory cell A12 connected to the bit line NBL is selected, data representing "L" is written to the memory cell A12 (see FIG. 5).

Figure 4:
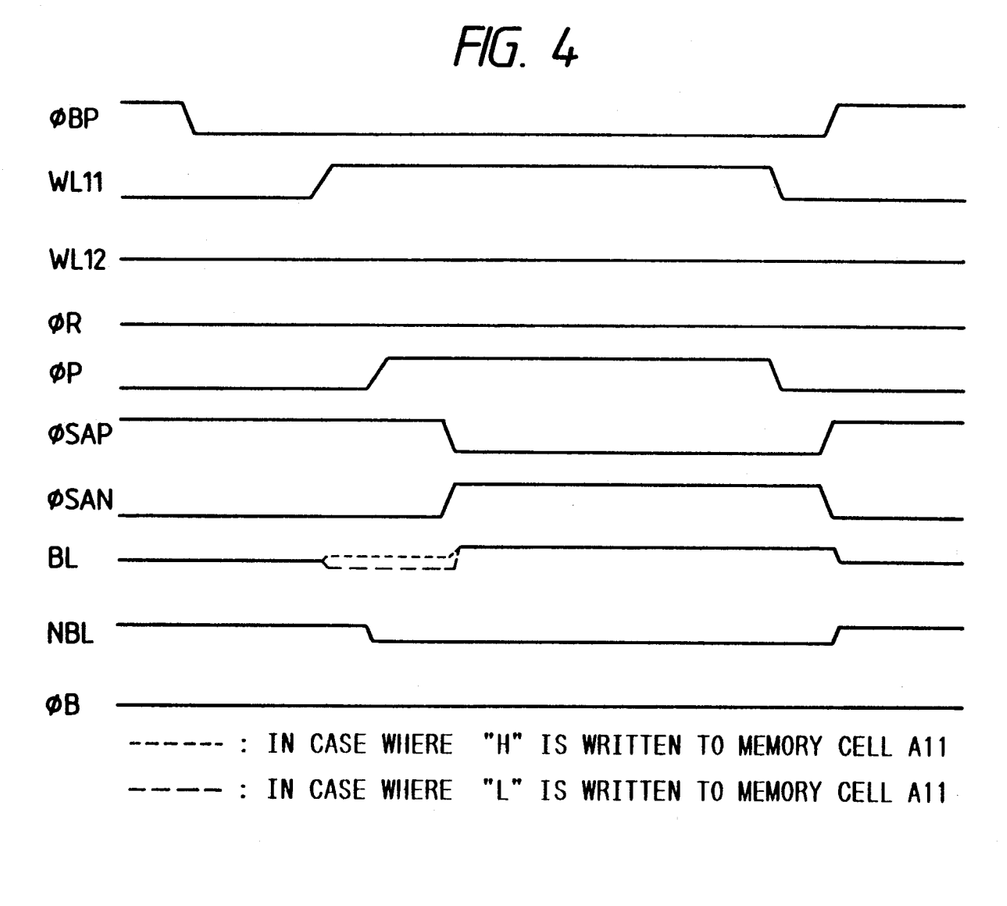
FIG. 4 is a timing chart for illustrating a presetting operation of the first embodiment of FIG. 1 in case where a memory cell connected to a bit line BL is selected.
Figure 5:
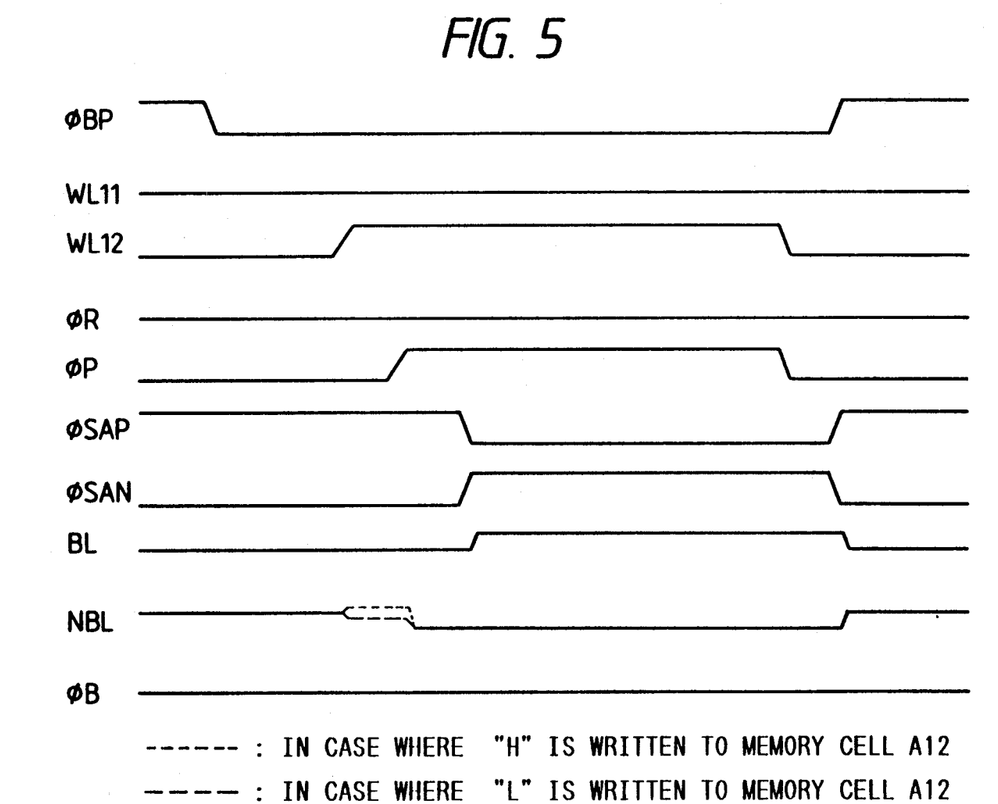
FIG. 5 is a timing chart for illustrating a presetting operation of the first embodiment of FIG. 1 in case where a memory cell connected to a bit line NBL is selected.

When data is read from either of the memory cells A11 and A12, in case where the data is read from the memory cell A11, data representing "H", which is in phase with the written data representing "H", is outputted therefrom. On the other hand, in case where the data is read from the memory cell A12, data representing "H", of which the phase is opposite to that of the written data representing "L", is outputted therefrom.

That is, if a word line is selected when a voltage level of the preset signal $\phi$P is made to be "H", it has come that data stored in all of the memory cells arranged on the selected word line is cleared in one cycle. Thus, in order to perform of preset of data in all of the memory cells of the first embodiment, the first embodiment has only to perform clearing operations in cycles of which the number is equal to that of the row addresses (i.e., that of the word lines).

Incidentally, in the first embodiment of FIG. 1, sources of the transistors $Q_{18}$ and $Q_{19}$ are connected to the reference potential Vss. However, even in case where the sources of the transistors $Q_{18}$ and $Q_{19}$ are connected to the electric potential Vcc of the power source as in a second embodiment of the present invention illustrated in FIG. 6, a clearing operation and a preset operation can be performed similarly as in the first embodiment of FIG. 1.

Voltage levels of the reset signal $\phi R$ and the preset signal $\phi P$ may be made to be "H" after the precharge of the word lines are finished and before the sense amplifier operates. Further, it is out of the question how the relation between the time when the reset signal $\phi R$ and the preset signal $\phi P$ are made to be "H" and the time at which a word line is selected should be regulated.

Next, a third embodiment of the present invention will be described in detail with reference to FIGS. 7~11.

Figure 7:
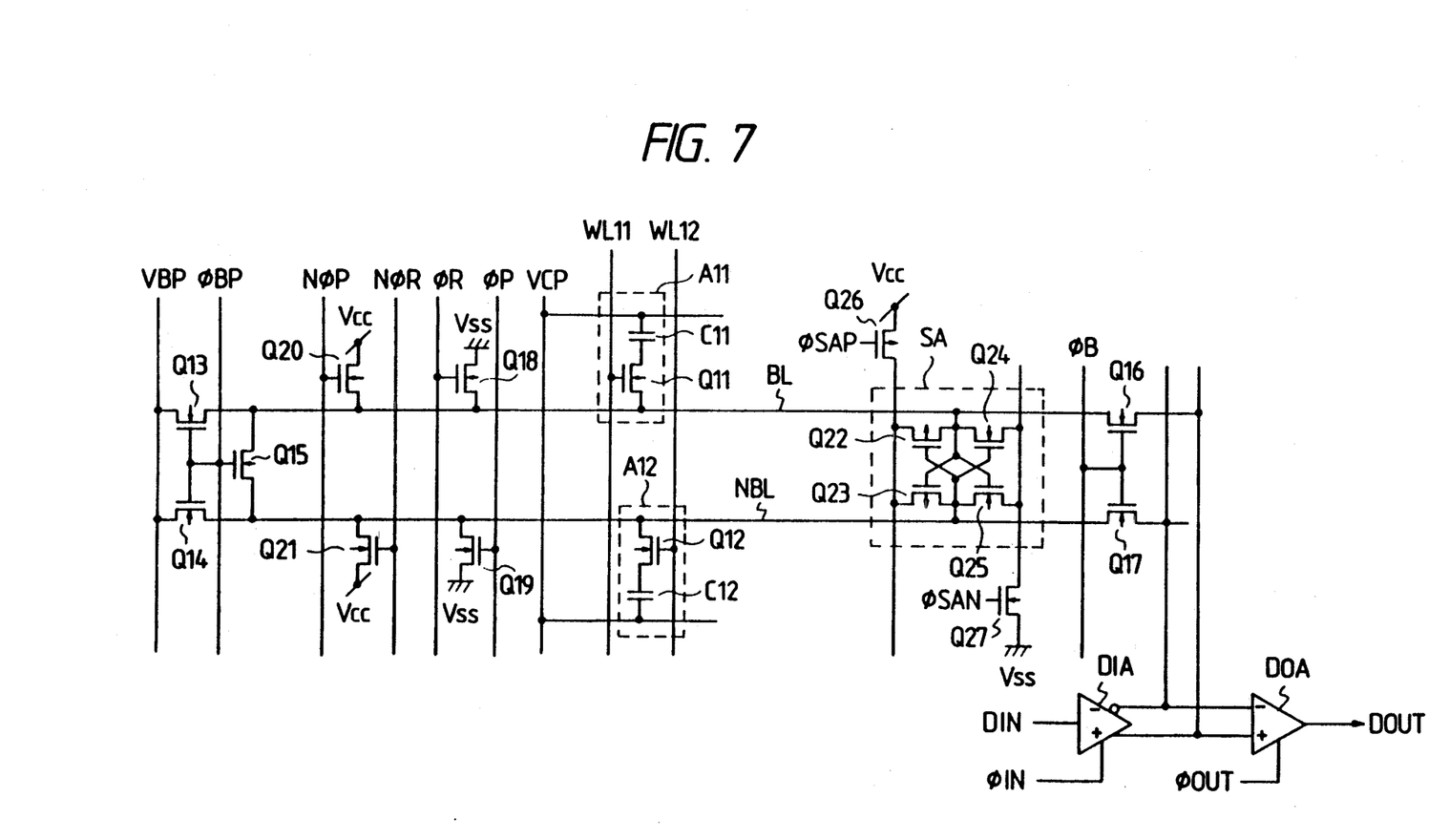
FIG. 7 is a circuit diagram of a third embodiment of the present invention (i.e., a third dynamic type semiconductor memory embodying the present invention)

In FIG. 7, circuits and elements having the same functions as corresponding circuits and elements of the first embodiment of FIG. 1 perform are designated by like reference characters as used to designate the corresponding circuits and elements of the first embodiment of FIG. 1. Thus, for simplicity of description, detailed description of such circuits and elements is omitted.

Further, the third embodiment of FIG. 7 is different in the following respects from the first embodiment of FIG. 1. That is, a p-channel transistor $Q_{20}$ is connected to both of and is provided between the bit line BL and the power source having the potential Vcc. Moreover, a preset signal $N\phi P$ is supplied to a gate of the transistor $Q_{20}$. A phase of the preset signal $N\phi P$ is opposite to a phase of the preset signal $\phi P$. On the other hand, a p-channel transistor $Q_{21}$ is connected to both of and is provided between the bit line NBL and the power source having the potential Vcc. Moreover, a reset signal $N\phi R$ is supplied to a gate of the transistor $Q_{21}$. A phase of the reset signal $N\phi R$ is opposite to a phase of the reset signal $\phi R$.

Incidentally, among the four transistors $Q_{18}$~$Q_{21}$, the transistors $Q_{18}$ and $Q_{20}$ operate as transistors for clearing data and on the other hand the transistors $Q_{21}$ and $Q_{22}$ operate as transistors for performing preset of data.

Next, an operation of the third embodiment will be described in detail with reference to FIGS. 8~11.

In cycles in which an ordinary read and write operations are performed, voltage levels of a reset signal $\phi R$ and a preset signal $\phi P$ are "L" and the transistors $Q_{18}$ and $Q_{19}$ are off. Thus, the bit lines BL and NBL are not connected to the reference potential Vss. On the other hand, voltage levels of a reset signal $N\phi R$ and a preset signal $N\phi P$ are "H" and thus the transistors $Q_{18}$ and $Q_{19}$ are off. Thus, the bit lines BL and NBL are not connected to the power source having the potential Vcc. As a result, in cycles in which an ordinary read and write operations are performed, operations of reading and writing data are effected in the third embodiment similarly as described with reference to FIG. 1.

Next, will be described hereinbelow an operation of the third embodiment in case of clearing data stored in the third embodiment.

Upon completion of the precharge of the bit lines, a voltage level of a reset signal $\phi R$ is made to be "H" after either of the word lines is selected and before the sense amplifier operates. Thereby, the transistor Q18 is turned on and further an electric potential of the bit line BL is forcedly made to be equal to the reference potential Vss. Further, in the same period of time, i.e., after either of the word lines is selected and before the sense amplifier SA operates, a voltage level of the reset signal $N\phi R$ is made to be "L". Thereby, the transistor $Q_{21}$ is turned on and a voltage level of the bit line NBL is forcedly made to be equal to the potential Vcc of the power source.

Figure 8:
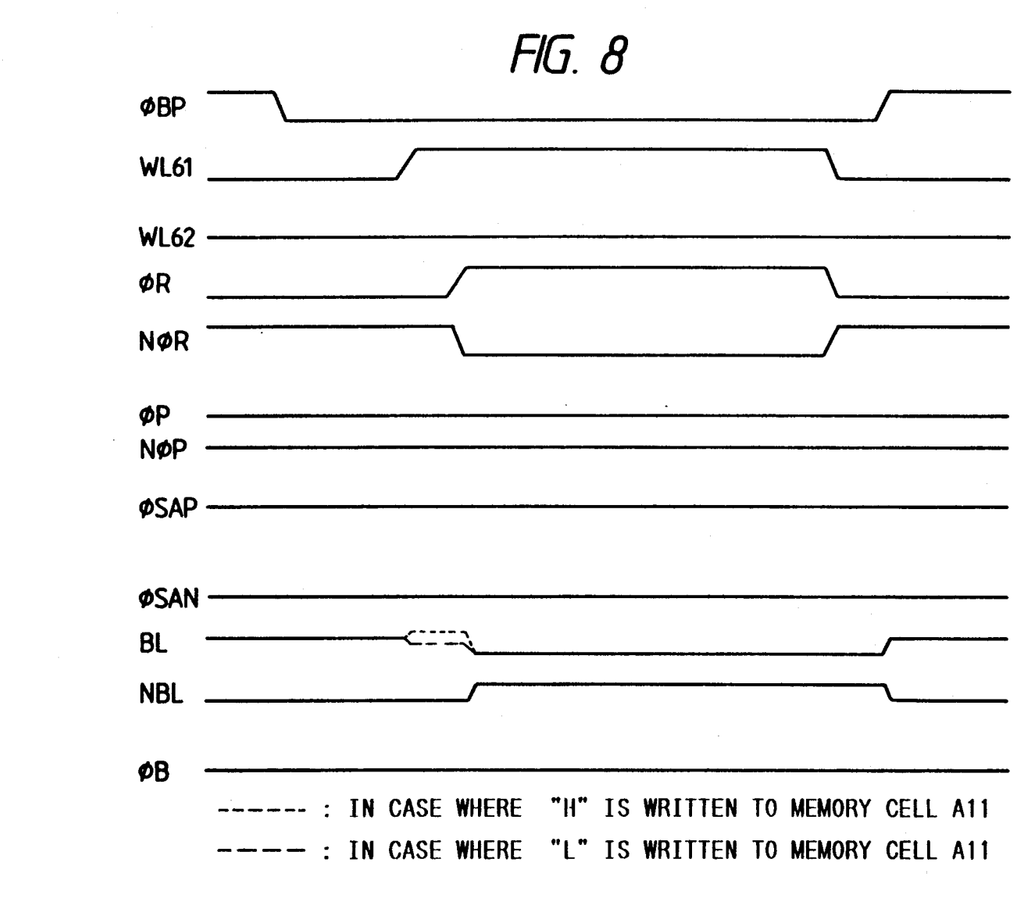
FIG. 8 is a timing chart for illustrating a clearing operation of the third embodiment of FIG. 7 in case where a memory cell connected to a bit line BL is selected.

In case where the memory cell A11 connected to the bit line BL is selected when the first embodiment is in this state, data representing "L" is written to the memory cell A11 (see FIG. 8). In contrast, in case where the memory cell A12 connected to the bit line NBL is selected, data representing "H" is written to the memory cell A12 (see FIG. 9).

Figure 9:
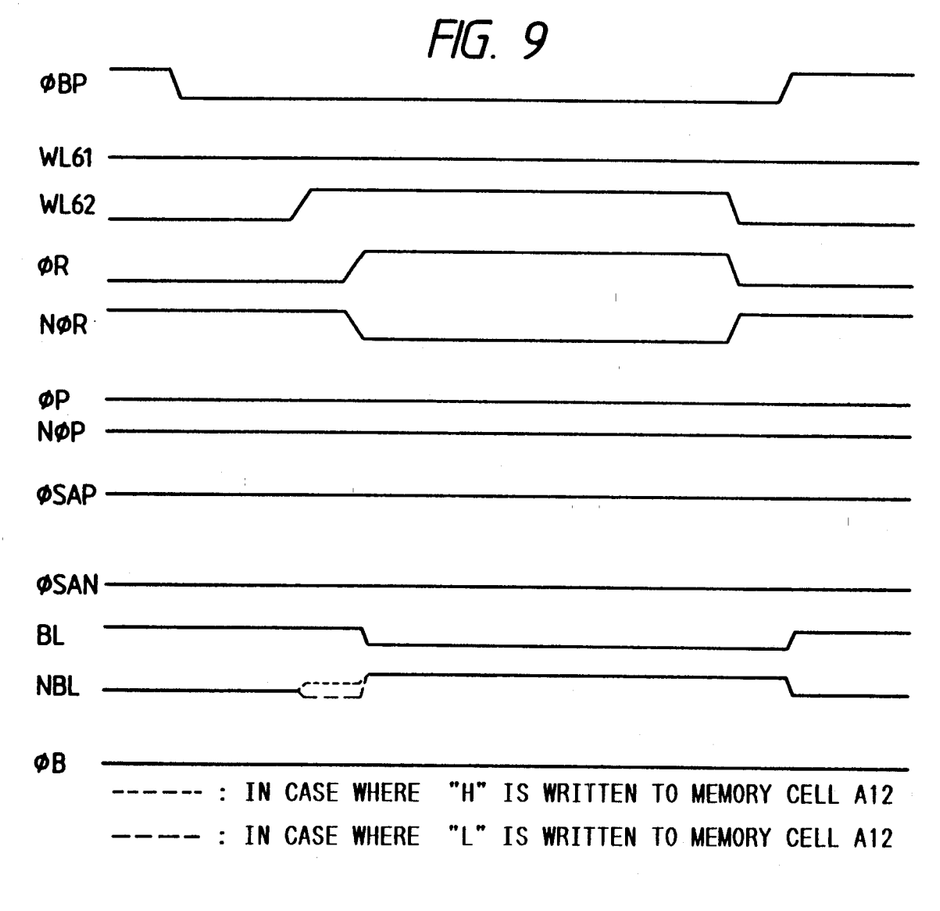
FIG. 9 is a timing chart for illustrating a clearing operation of the third embodiment of FIG. 7 in case where a memory cell connected to a bit line NBL is selected.

When data is read from either of the memory cells A11 and A12, in case where the data is read from the memory cell A11, data representing "L", which is in phase with the written data representing "L", is outputted therefrom. On the other hand, in case where the data is read from the memory cell A12, data representing "H", of which the phase is opposite to that of the written data representing "H", is outputted therefrom.

That is, if a word line is selected when a voltage level of the reset signal $\phi R$ is made to be "H" and a voltage of the reset signal $N\phi R$ is made to be "L", it has come that data stored in all of the memory cells arranged on the selected word line is cleared in one cycle. Thus, in order to clear data stored in all of the memory cells of the first embodiment, the first embodiment has only to perform clearing operations in cycles of which the number is equal to that of the row addresses (i.e., that of the word lines).

Especially, in a cycle in which an operation of clearing data is performed in the third embodiment of FIG. 7, it is not necessary to operate the sense amplifier. Thus, the third embodiment can clear data from memory cells thereof in a cycle shorter than the cycle in which a clearing operation is effected in the first embodiment of FIGS. 1 and 2.

Next, will be described hereinbelow an operation of the third embodiment in case of performing preset of data in the third embodiment.

Upon completion of the precharge of the bit lines a voltage level of a preset signal $\phi P$ is made to be "H" after either of the word lines is selected and before the sense amplifier operates. Thereby, the transistor $Q_{19}$ is turned on and an electric potential of the bit line NBL is forcedly made to be equal to the reference potential Vss. Further, in the same period of time, a voltage level of the reset signal $N\phi P$ is made to be "L". Thereby, a voltage level of the bit line BL is forcedly made to be equal to the potential Vcc of the power source.

Figure 10:
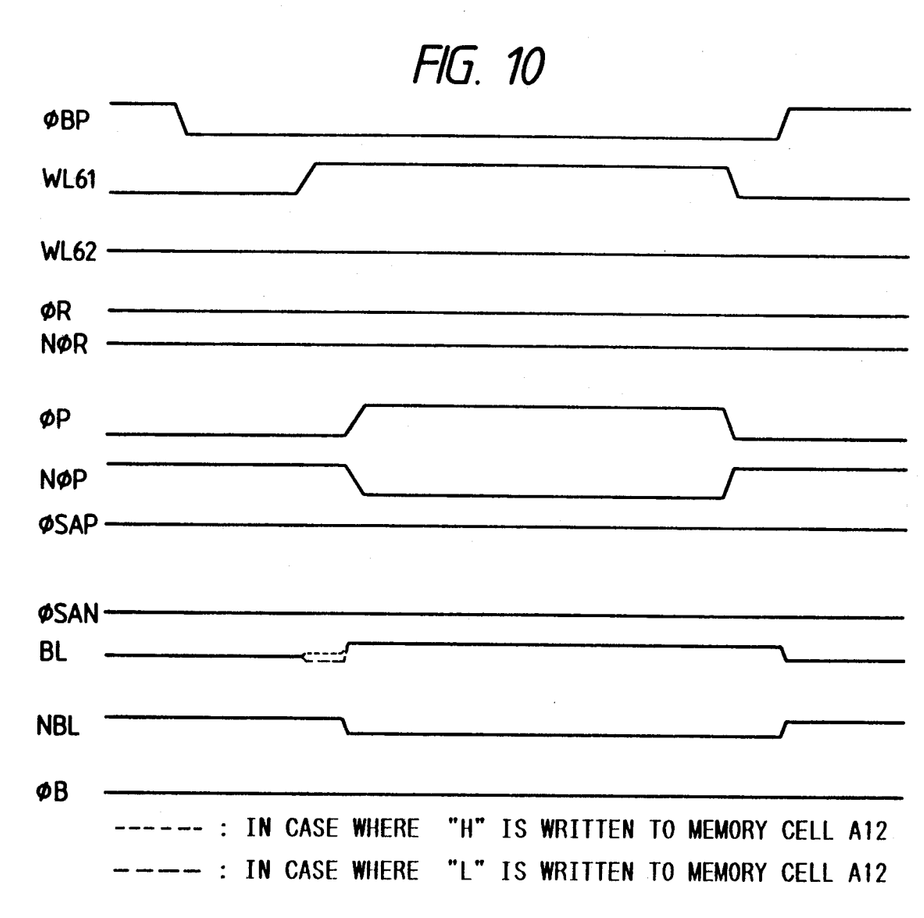
FIG. 10 is a timing chart for illustrating a presetting operation of the third embodiment of FIG. 7 in case where a memory cell connected to a bit line BL is selected.

In case where the memory cell A11 connected to the bit line BL is selected when the first embodiment is in this state, data representing "H" is written to the memory cell A11 (see FIG. 10). In contrast with this, in case where the memory cell A12 connected to the bit line NBL is selected, data representing "L" is written to the memory cell A12 (see FIG. 11).

Figure 11:
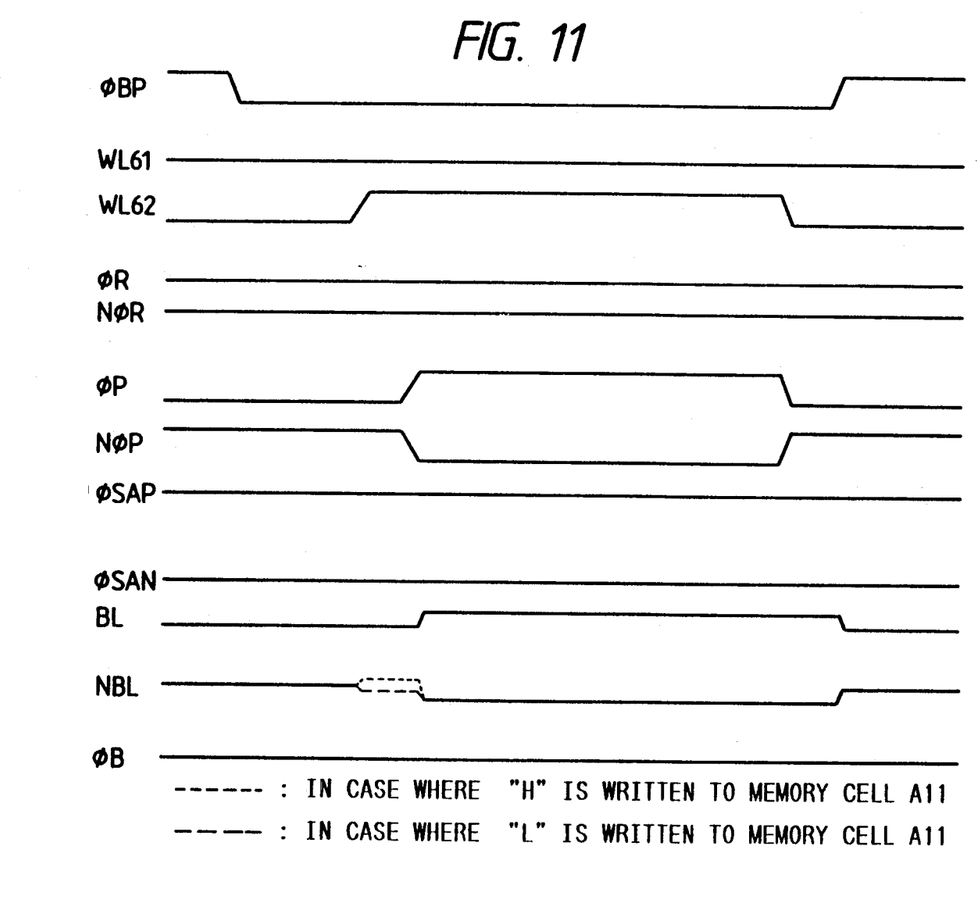
FIG. 11 is a timing chart for illustrating a presetting operation of the third embodiment of FIG. 7 in case where a memory cell connected to a bit line NBL is selected.

When data is read from either of the memory cells A11 and A12, in case where the data is read from the memory cell A11, data representing "H", which is in phase with the written data thereto, is outputted therefrom. On the other hand, in case where the data is read from the memory cell A12, data representing "H", of which the phase is opposite to that of the written data thereto, is outputted therefrom.

That is, if a word line is selected when a voltage level of the preset signal $\phi P$ is made to be "H" and a voltage level of the preset signal $N\phi P$ is made to be "L", it has come that data stored in all of the memory cells arranged on the selected word line is cleared in one cycle. Thus, in order to effect preset of data in all of the memory cells of the third embodiment, the third embodiment has only to perform clearing operations in cycles of which the number is equal to that of the row addresses (i.e., that of the word lines).

Especially, in a cycle in which an operation of performing preset of data is effected in the third embodiment of FIG. 7, it is not necessary to operate the sense amplifier. Thus, the third embodiment can preset data in memory cells thereof in a cycle shorter than the cycle in which a preset operation is effected in the first embodiment of FIGS. 1 and 2.

Incidentally, in the third embodiment of FIG. 7, voltage levels of the reset signal $\phi R$ and $N\phi R$ and the preset signal $\phi P$ and $N\phi P$ may be made to be "H" after the precharge of the word lines are finished and before the sense amplifier operates. Further, it is out of the question how the relation between the time when the reset signal $\phi R$ and $N\phi R$ and the preset signal $\phi P$ and $N\phi P$ are made to be "H" and the time at which a word line is selected should be regulated.

Figure 6:
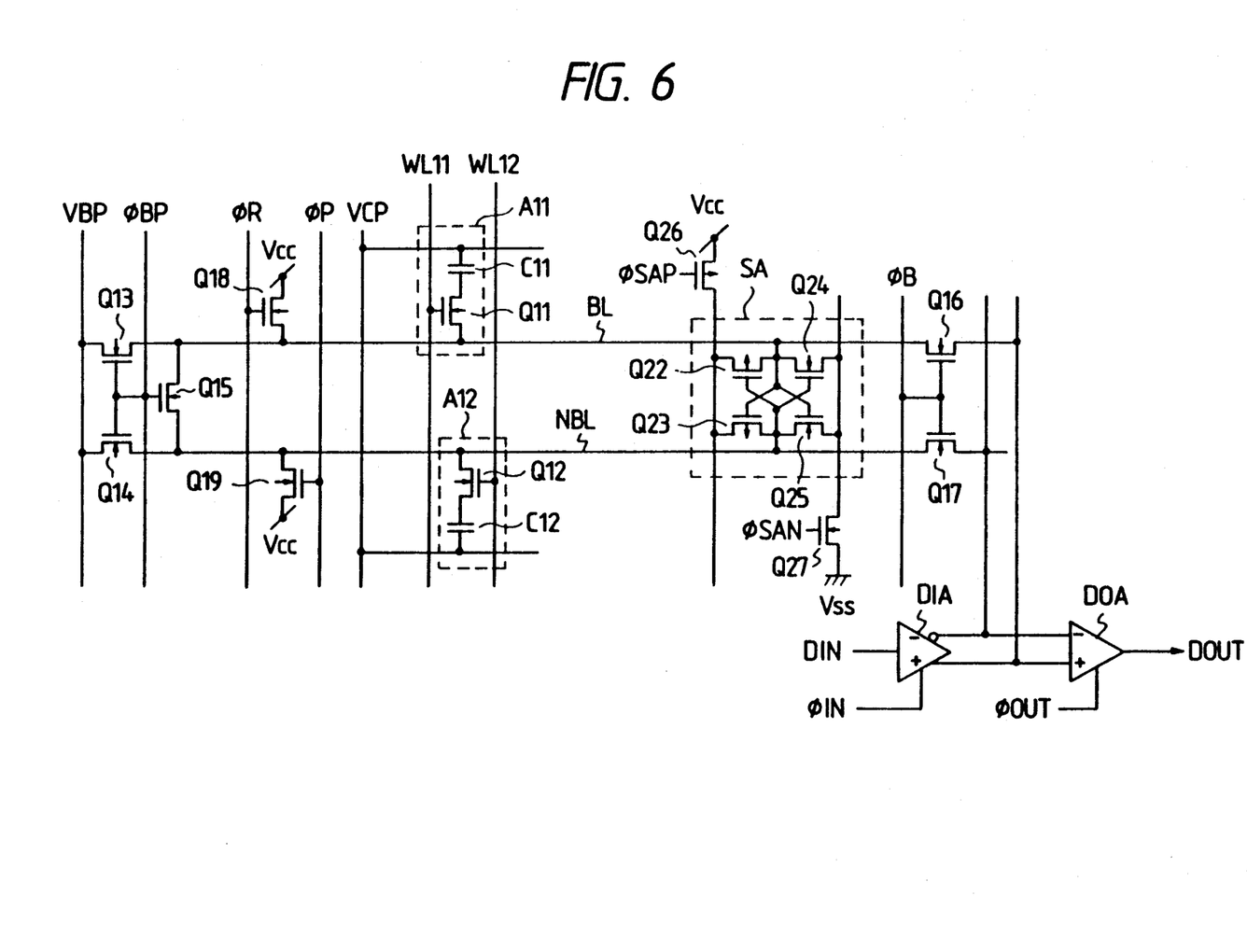
FIG. 6 is a circuit diagram of a second embodiment of the present invention (i.e., a second dynamic type semiconductor memory embodying the present invention)

Incidentally, in each of FIGS. 1, 6 and 7, only a part of the corresponding embodiment, in which the two bit lines BL and NBL and the two word lines WL11 and WL12 intersect. However, in a practical dynamic type semiconductor memory according to the present invention, many bit lines and many word lines are arranged like a matrix and a memory cell is connected to each of intersections of bit lines and the word lines. Apparently, in all of the bit lines and the word lines, the transistors $Q_{18} \sim Q_{21}$ are connected to the bit lines and the word lines as illustrated in FIGS. 1, 6 and 7.

While preferred embodiments of the present invention has been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. A dynamic type semiconductor memory comprising:

a plurality of pairs of bit lines and a plurality of word lines which are arranged like a matrix, each pair of bit lines comprising first and second lines;

a plurality of memory cells connected to intersections of said plurality of pairs of bit lines and said plurality of word lines;

a plurality of sense amplifiers for amplifying data stored in said plurality of memory cells;

first connecting means for connecting said first line of each pair of bit lines to a first electric potential different from a pre-charge electric potential in response to a first reset signal after pre-charge of said plurality of bit lines is finished and further a word line is selected from said plurality of word lines and before said sense amplifier corresponding to said selected word line operates;

second connecting means for connecting said second line of each pair of bit lines to a second electric potential different from the pre-charge electric potential and the first electric potential in response to a second reset signal, having a phase opposite to a phase of the first reset signal, after the pre-charge of said plurality of bit lines is finished and further the word line is selected from said plurality of word lines and before said sense amplifier corresponding to said selected word line operates;

third connecting means for connecting said second line of each pair of bit lines to the first electric potential in response to a first preset signal after pre-charge of said plurality of bit lines is finished and further the word line is selected from said plurality of word lines and before said sense amplifier corresponding to said selected word line operates; and fourth connecting means for connecting said first line of each pair of bit lines to the second electric potential in response to a second preset signal, having a phase opposite to a phase of the first preset signal, after the pre-charge of said plurality of bit lines is finished and further the word line is selected from said plurality of word lines and before said sense amplifier corresponding to said selected word line operates.

* * * * *

UNITED STATES PATENT AND TRADEMARK OFFICE
CERTIFICATE OF CORRECTION

PATENT NO. : 5,227,697
DATED : July 13, 1993
INVENTOR(S) : Masahiko SAKAGAMI

It is certified that error appears in the above-indentified patent and that said Letters Patent is hereby corrected as shown below:

On title page, item [73] should read as follows:

--Matsushita Electronics Corporation--

Signed and Sealed this

Twelfth Day of April, 1994

Attest:

BRUCE LEHMAN

Attesting Officer

Commissioner of Patents and Trademarks